(12) United States Patent
Yato

(10) Patent No.: US 6,914,228 B2
(45) Date of Patent: Jul. 5, 2005

(54) SOLID-STATE IMAGING DEVICE

(75) Inventor: Hidenori Yato, Oizumi-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/772,295

(22) Filed: Feb. 6, 2004

(65) Prior Publication Data

US 2004/0206991 A1 Oct. 21, 2004

(30) Foreign Application Priority Data

Feb. 21, 2003 (JP) ........................................ 2003-043609

(51) Int. Cl.$^7$ .......................................... H01L 27/146
(52) U.S. Cl. ................................... 250/208.1; 257/292
(58) Field of Search ............................... 257/291, 292; 250/208.1

(56) References Cited

U.S. PATENT DOCUMENTS

| | | | |
|---|---|---|---|
| 6,051,857 A | 4/2000 | Miida | 257/292 |
| 6,423,958 B1 * | 7/2002 | Okamoto et al. | 250/208.1 |
| 6,448,596 B1 * | 9/2002 | Kawajiri et al. | 257/292 |
| 6,476,371 B2 * | 11/2002 | Miida | 250/208.1 |
| 6,504,194 B1 * | 1/2003 | Miida | 257/292 |

* cited by examiner

*Primary Examiner*—Gene M. Munson
(74) *Attorney, Agent, or Firm*—Oliff & Berridge, PLC

(57) ABSTRACT

A solid-state imaging device that can include a pixel array where a plurality of unit pixels including a photo diode and an insulated gate field effect transistor for detecting photocharges are arranged, and a control circuit that controls the operation of the pixel array. The control circuit can include a drain control circuit that provides any of constant voltage, a constant current, and constant charges to a drain diffused region. The control circuit previously forward biases a junction region between a semiconductor substrate of a first conductivity type and a semiconductor layer of a second conductivity type by any of the constant voltage, the constant current, and the constant charges, that is provided from the drain control circuit to the drain diffused region, so as to accumulate a predetermined amount of charges of a predetermined conductivity type in an accumulation region, and the charges of a predetermined conductivity type accumulated in the accumulation region are discharged thereafter. Accordingly the invention can avoid deterioration of image quality caused by a residual image due to photocharges accumulated in previous imaging.

7 Claims, 13 Drawing Sheets

SOLID-STATE IMAGING DEVICE

Japanese Patent Application No. 2003-043609, filed on Feb. 21, 2003, is hereby incorporated by reference in its entirety.

BACKGROUND OF THE INVENTION

1. Field of Invention

The present invention relates to a MOS solid-state imaging element of a threshold voltage modulation system.

2. Description of Related Art

A variety of electronic equipment, such as cellular phones and digital cameras provided with a miniaturized camera have been becoming more popular. As an example of an imaging element for such a camera, a MOS solid-state imaging element that is referred to as an imaging element of a threshold voltage modulation system has been developed. See, for example, Japanese Patent Publication Laid-Open No. 11-195778.

When an imaging element of a threshold voltage modulation system is compared to a Charge Coupled Device CCD solid-state imaging element that has the same pixel size and pixel number as it, the power consumption thereof is lower than that of a CCD solid-state imaging element although it is inferior to a CCD solid-state imaging element in optical sensitivity. In addition, compared to a CMOS: Complementary Metal Oxide Semiconductor CMOS solid-state imaging element that has the same pixel size and pixel number, an imaging element of a threshold voltage modulation system has higher optical sensitivity although the power consumption is the same.

An imaging element of a threshold voltage modulation system has a special pixel structure in order to enhance the optical sensitivity thereof more than that of a CMOS solid-state imaging element and improve the image quality. Specifically, in one pixel (it is also referred to as "unit pixel" hereinafter) of a CMOS solid-state imaging element, three (3) or four (4) transistors are used in order to convert charges that were photoelectrically converted in response to the amount of received light by a photo diode (they are also referred to as "photocharges" hereinafter) into voltage (it is referred to as "charge-voltage conversion" hereinafter) and amplify it. Meanwhile, in one unit pixel of an imaging element of a threshold voltage modulation system, only one transistor is used. Furthermore, a structure that is special and is different from that of a general MOS transistor is used for this one transistor. Specifically, a hollow of energy that is referred to as a carrier pocket (it is also referred to as "well") is formed in the transistor. This carrier pocket has a structure where potential against, for example, a hole is lowered. Therefore, holes (they are also referred to as "photoholes") of photocharges generated in a photo diode is accumulated. The threshold of a transistor changes depending on the number of photoholes accumulated in a carrier pocket such that the source potential of a source follower formed of this transistor changes. Therefore, pixel data depending on the amount of received light can be detected by reading out source potential that changes depending on the number of photoholes accumulated in a carrier pocket.

SUMMARY OF THE INVENTION

When one image is picked up by an imaging element of a threshold voltage modulation system, photocharges accumulated in a carrier pocket of each pixel are discharged (reset) before imaging. This is because, if photocharges accumulated in previous imaging remain, the residual photocharges are added to photocharges based on which image data is read out such that there is the case where the residual photocharges cause negative effect on each detected pixel data as a residual image. However, in general, it is difficult to discharge photocharges accumulated in previous imaging from a carrier pocket completely within a certain limited time. Therefore, in an imaging element of a threshold voltage modulation system, there is a need for avoiding the deterioration of image quality caused by a residual image due to photocharges accumulated in previous imaging.

In view of the above-described problem, the present invention is intended to provide an art by which the deterioration of image quality caused by a residual image due to photocharges accumulated in previous imaging can be avoided in an imaging element of a threshold voltage modulation system.

A solid-state imaging device of the present invention can include a pixel array having a plurality of unit pixels. Each of the unit pixels can include a photo diode and an insulated gate field effect transistor for detecting photocharges. The solid-state imaging device also includes a control circuit controlling the operation of the pixel array. One of a P type and an N type is a first conductivity type, and the other is a second conductivity type hereinafter. The photo diode and the insulated gate field effect transistor share a well region of the first conductivity type that is formed in a semiconductor layer of the second conductivity type. The semiconductor layer of the second conductivity type is formed on a semiconductor substrate of the first conductivity type. The insulated gate field effect transistor includes a source diffused region of the second conductivity type formed on a surface of the well region, a drain diffused region of the second conductivity type formed on a surface of the semiconductor layer other than the surface of the well region. The transistor also includes a gate electrode formed over the well region between the drain diffused region and the source diffused region with a gate insulating film therebeween, and a channel region formed in the surface of the well region below the gate electrode and having an impurity layer of the second conductivity type.

The transistor also includes a heavily doped buried layer of the first conductivity type formed under the channel region in the well region and near the source diffused region, having an impurity concentration higher than that of the well region, and being an accumulation region that accumulates charges of a given conductivity type generated in response to light incident on the photo diode.

The control circuit can include a drain control circuit providing any of constant voltage, a constant current, and constant charges to the drain diffused region. The control circuit previously forward biases a junction region between the semiconductor substrate and the semiconductor layer by the any of the constant voltage, the constant current, and the constant charges, that is provided from the drain control circuit to the drain diffused region, so as to accumulate a predetermined amount of the charges of the given conductivity type in the accumulation region, and the charges of a given conductivity type accumulated in the accumulation region are discharged thereafter.

In the solid-state imaging device of the invention, before the charges of a given conductivity type accumulated in the accumulation region are discharged, the junction region between the semiconductor substrate and the semiconductor layer is forward biased by any of the constant voltage, the constant current, and the constant charges, that is provided from the drain control circuit to the drain diffused region, and thereby a predetermined amount of the charges of a given conductivity type can be accumulated in the accumulation region previously. Thus, since the charges of a given conductivity type accumulated in the accumulation region can be discharged after a predetermined amount of the charges are accumulated, the amount of the charges of a given conductivity type that remain in the accumulation region after a certain discharging period can be made be almost constant. If the amount of residual charges of a given conductivity type is almost constant, using the state where the constant amount of the charges of a given conductivity type remain, as a reference, the amount of the charges of a given conductivity type accumulated in response to incident light can be detected. Therefore, in a solid-state imaging element of a threshold voltage modulation system, the deterioration of image quality caused by a residual image due to charges accumulated in previous imaging can be avoided.

In addition, the drain control circuit preferably includes a dummy diode with a junction region between the semiconductor substrate and the semiconductor layer included in a dummy pixel that has the same structure as the structure of the unit pixel, and a constant current source providing a forward current to the dummy diode. The drain control circuit preferably generates the constant voltage that is provided to the drain diffused region, based on forward voltage from the dummy diode.

In the drain control circuit, the voltage that is provided to the drain diffused region is generated based on the forward voltage from the dummy diode whose structure is the same as that of the junction region that exists between the semiconductor substrate and the semiconductor layer and that is to be forward biased. Therefore, even if the temperature of the junction region changes such that a bias state of the junction region that is required for accumulating a predetermined amount of the charges in the accumulation region changes, the forward voltage from the dummy diode changes correspondingly so as to make the bias state of the junction region be in a required state. Thus, it can be prevented that a predetermined amount of the charges are not accumulated in the accumulation region. Furthermore, it can be prevented that extra charges more than a predetermined amount are accumulated in the accumulation region so as to cause the increase of power consumption.

In addition, the drain control circuit may include a constant current source and may generate the constant current that is provided to the drain diffused region.

This also makes the bias state of the junction region be in a required state. Thus, it can be prevented that a predetermined amount of the charges are not accumulated in the accumulation region. Furthermore, it can be prevented that extra charges more than a predetermined amount are accumulated in the accumulation region so as to cause the increase of power consumption.

Furthermore, the drain control circuit may include a capacitor, a power source for charging the capacitor, and a switch connecting one terminal of the capacitor to either of an output terminal of the power source for charging and the drain diffused region. The drain control circuit may connect the one terminal of the capacitor to the output terminal of the power source for charging so as to charge the capacitor, during a period other than a predetermined period when the junction region between the semiconductor substrate and the semiconductor layer is forward biased. The drain control circuit may connect the one terminal of the capacitor to the drain diffused region so as to generate the constant charges that are provided to the drain diffused region, during the predetermined period.

This also makes the bias state of the junction region be in a required state. Thus, it can be prevented that a predetermined amount of the charges are not accumulated in the accumulation region. Furthermore, it can be prevented that extra charges more than a predetermined amount are accumulated in the accumulation region so as to cause the increase of power consumption.

Moreover, the drain control circuit provides only required amount of charges for accumulating a predetermined amount of the charges of a given conductivity type in the accumulation region. Therefore, power consumption can be more effectively reduced.

In addition, a state where a predetermined amount of the charges of a given conductivity type are accumulated is preferably the saturated state where the maximum amount of the available charges of a given conductivity type are accumulated in the accumulation region.

Since the saturated state where the maximum amount of the available charges of a given conductivity type are accumulated in the accumulation region is almost constant, if the junction region between the semiconductor substrate and the semiconductor layer is forward biased, the accumulation state of the accumulation region can be easily made be in a saturated state regardless of the amount of the charges accumulated in the accumulation region.

Furthermore, if the first conductivity type is a P type and the second conductivity type is an N type, the charges of a given conductivity type are holes. Furthermore, if the first conductivity type is an N type and the second conductivity type is a P type, the charges of a given conductivity type are electrons.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments of the present invention will be described below.

Figure 1:
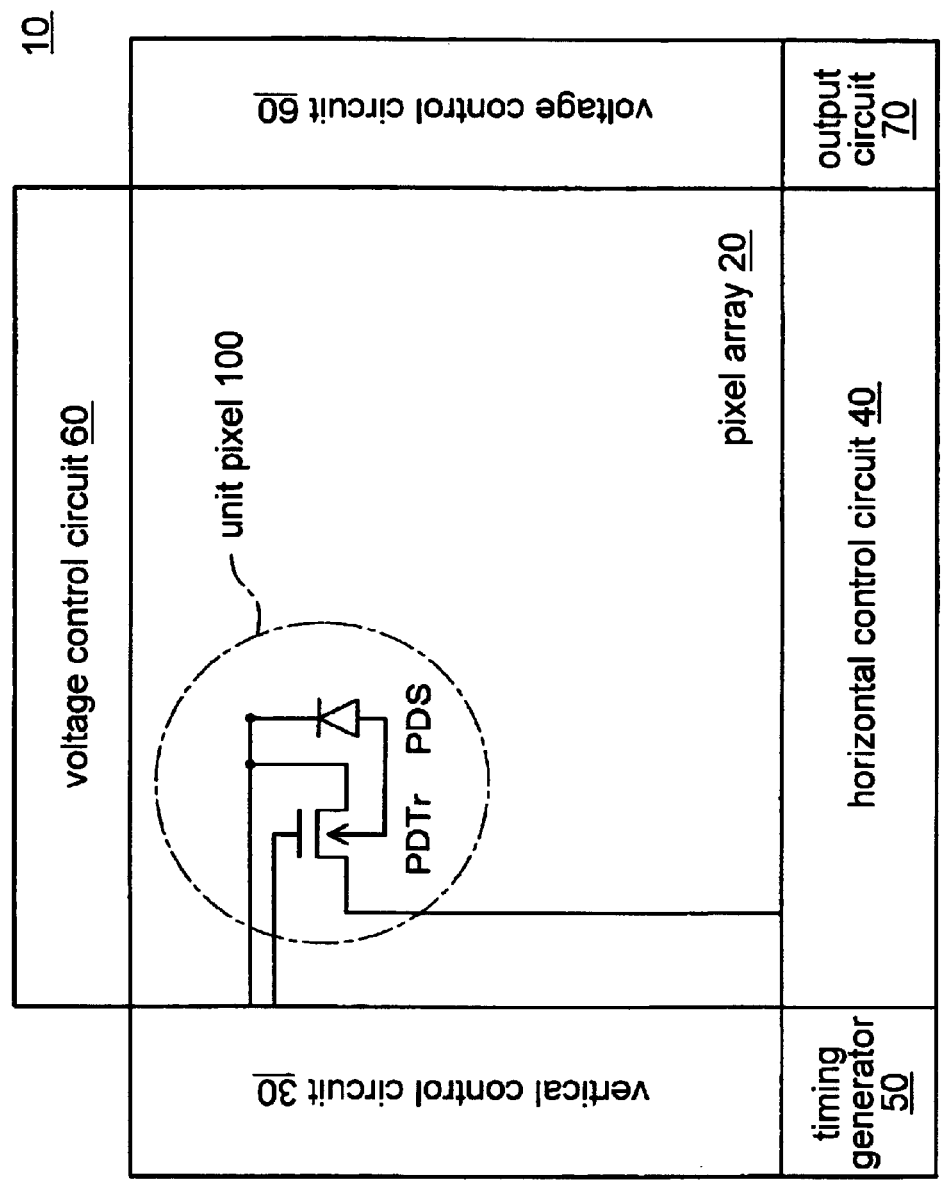
FIG. 1 is an explanatory diagram showing the whole structure of an image sensor (a solid-state imaging device) according to an embodiment of the present invention.

A. Structure of a Solid-state Imaging Device:

FIG. 1 is an explanatory diagram showing the whole structure of an image sensor (a solid-state imaging device) according to an embodiment of the present invention. An image sensor 10 includes a pixel array 20 where a unit pixel 100 corresponds to one pixel of an image and a plurality of them are arranged in a matrix. The unit pixel 100 is formed of a single of photo diode (PDS) and a single of NMOS transistor (PDTr) for detecting photocharges.

In addition, a vertical control circuit 30 and a horizontal control circuit 40 that drive the unit pixel 100 arranged in a matrix in the pixel array 20 are disposed on the left side and the lower side of the pixel array 20, respectively. Furthermore, between the vertical control circuit 30 and the horizontal control circuit 40, a timing generator 50 that generates a timing signal becoming the standard of the operation of the vertical and horizontal control circuits 30 and 40 is disposed. In addition, a voltage control circuit 60 that generates a variety of voltage needed for the operation of each unit pixel 100 is disposed on the right and upper sides of the pixel array 20. Furthermore, an output circuit 70 that outputs picked up image data is disposed on the right side of the horizontal control circuit 40.

Figure 2:
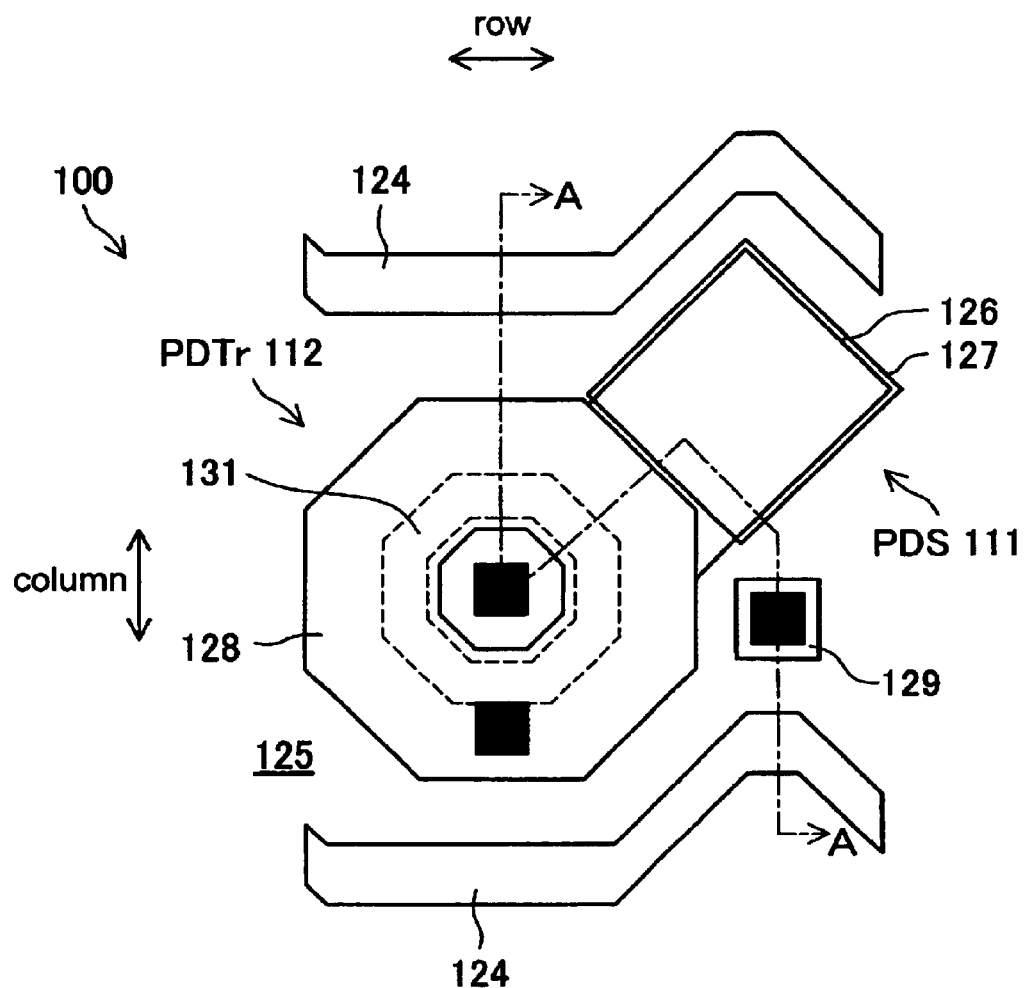
FIG. 2 is a schematic plan view showing an example of the layout of elements in a unit pixel.
Figure 3:
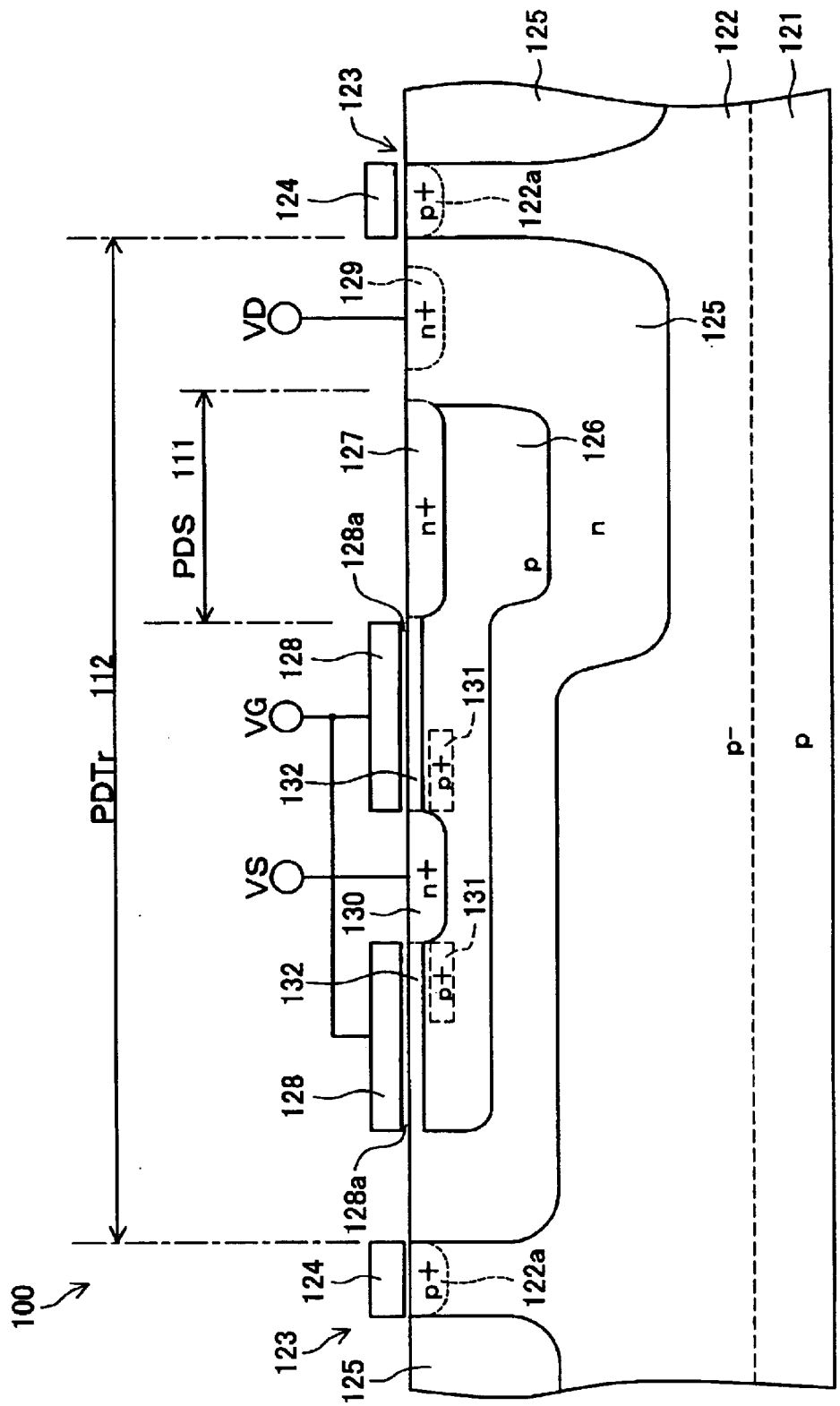
FIG. 3 is a schematic sectional view along A—A line of FIG. 2.

FIG. 2 is a schematic plan view showing an example of the layout of elements in a unit pixel. FIG. 3 is a schematic sectional view along A—A line of FIG. 2. In the unit pixel 100, a photo diode (PDS) 111 and an NMOS transistor (PDTr) 112 for detecting photocharges are formed adjacent to each other.

As shown in FIG. 3, on a substrate 121 that is made of P type silicon (it is also referred to as "P type substrate" hereinafter), P type silicon whose impurity concentration is lower than that of the substrate 121 (it is referred to as "P− type" hereinafter) is epitaxially grown, and thereby a P− type substrate layer 122 is formed on the substrate 121. The P type substrate 121 and the P− type substrate layer 122 substantially form a P type semiconductor substrate. In addition, on a boundary of unit pixels adjacent to each other in a column direction, a pixel isolation region 123 defined by an element isolation gate 124 formed on the P− type substrate layer 122 and a surface of the substrate through an oxide film not shown in the drawing is formed. Each unit pixel 100 is electrically isolated from other pixels in the column direction by the pixel isolation region 123. The pixel isolation region 123 is not formed on a boundary of unit pixels adjacent to each other in a row direction. Unit pixels in the row direction share a single of well region 125 with an N type (it is referred to as "N well region" hereinafter). Here, the pixel isolation region 123 may be formed on a boundary of unit pixels adjacent to each other in the row direction. An impurity diffused region 122a with a P type and whose impurity concentration is higher than that of the P type substrate 121 (it is referred to as "P+ type" hereinafter) is formed on a surface of the P− type substrate layer 122 in the pixel isolation region 123 in order to enhance the degree in isolation between the N well region 125 and the N well region 125 adjacent thereto. Specifically, punch-through that is caused on a surface part between the N well region 125 and the N well region 125 adjacent thereto is avoided.

In addition, in a region of the N well region 125 corresponding to a single of the unit pixel 100, a single of P well region 126 that is shared by the photo diode 111 and the NMOS transistor 112 is buried. The P well region 126 of the photo diode 111 forms a region where charges are generated by light irradiation. The P well region 126 of the NMOS transistor 112 forms a region where charges are transferred and a region where charges are accumulated.

The photo diode 111 is formed of the P well region 126, the N well region 125, and an impurity diffused region 127 that is formed on the surface of the N well region 125 to sandwich the P well region 126. The impurity diffused region 127 is an N type region whose impurity concentration is higher than that of the N well region 125 (it is referred to as "N+ type" hereinafter).

The NMOS transistor 112 includes a ring-shaped gate electrode 128. The ring-shaped gate electrode 128 is surrounded by the N well region 125. A drain diffused region 129 with an N+ type is formed on any part of a surface of the N well region 125 surrounding the gate electrode 128 and the P well region 126. Furthermore, a source diffused region 130 with an N+ type is formed on the center part of the gate electrode 128. In addition, a gate insulating film 128a is formed between the gate electrode 128 and an N well region 132, which is under the gate electrode 128. The N well region 132, which is in a surface of the P well region 126 under the gate electrode 128, becomes a channel region.

Furthermore, a carrier pocket 131 with a P+ type is formed in the P well region 126 under the channel region to surround the source diffused region 130. Details about the carrier pocket 131 will be described later.

Here, three black squares shown in the plan view of FIG. 2 indicate contact areas of a gate electrode, a drain electrode, and a source electrode. However, in the sectional view of FIG. 3, these contact areas are omitted and voltage of each electrode is indicated as gate voltage VG, drain voltage VD, and source voltage VS.

Figure 4:
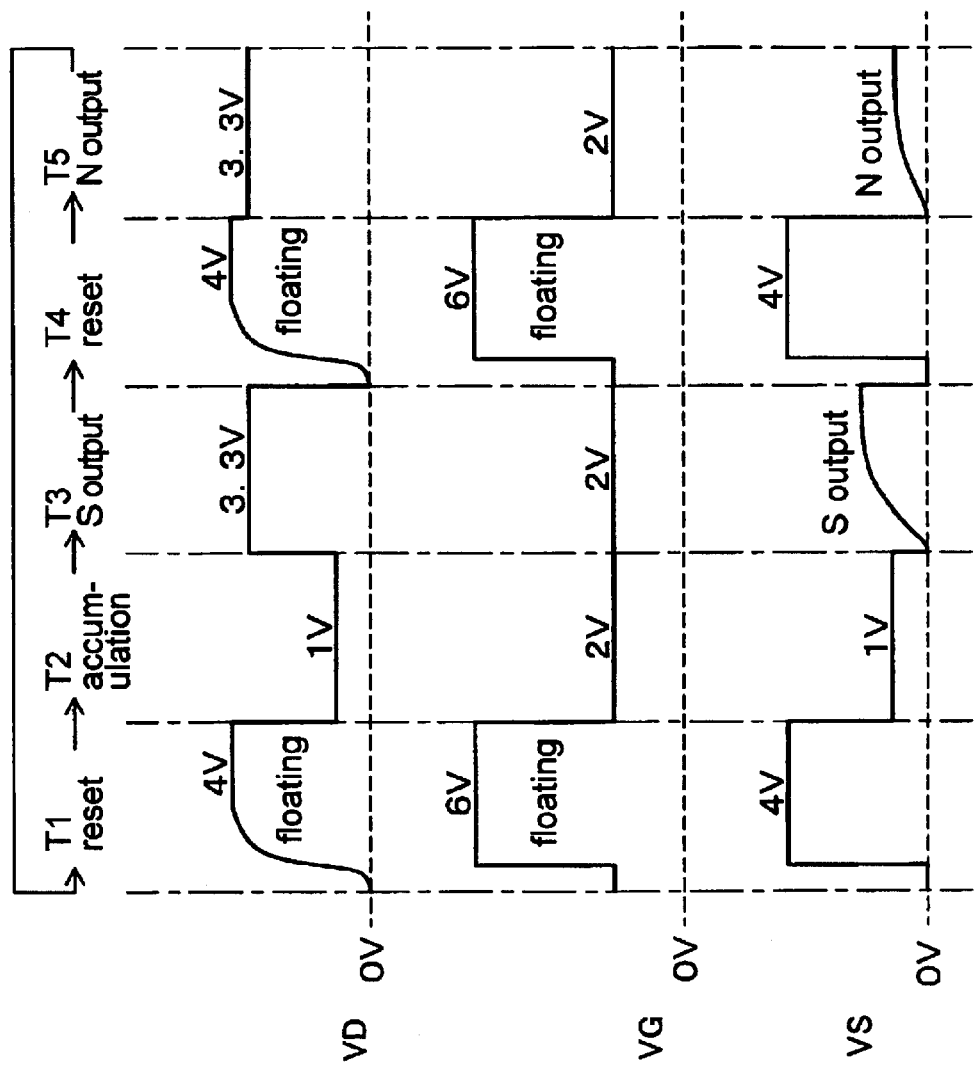
FIG. 4 is an explanatory diagram showing the sequence of imaging in one unit pixel as a comparative example.

B. Imaging Operation of a Comparative Example:

First, the basic imaging operation is explained as a comparative example previous to the explanation of the imaging operation of the present embodiment. FIG. 4 is an explanatory diagram showing the sequence of imaging in one unit pixel as a comparative example. As shown in FIG. 4, one time of imaging operation is executed through five periods of a reset period (T1), an accumulation period (T2), a signal output period (T3), a reset period (T4), and a noise output period (T5). The imaging operation is repeatedly executed by repeating this sequence. Here, each of another unit pixels is the same as this.

Figure 5:
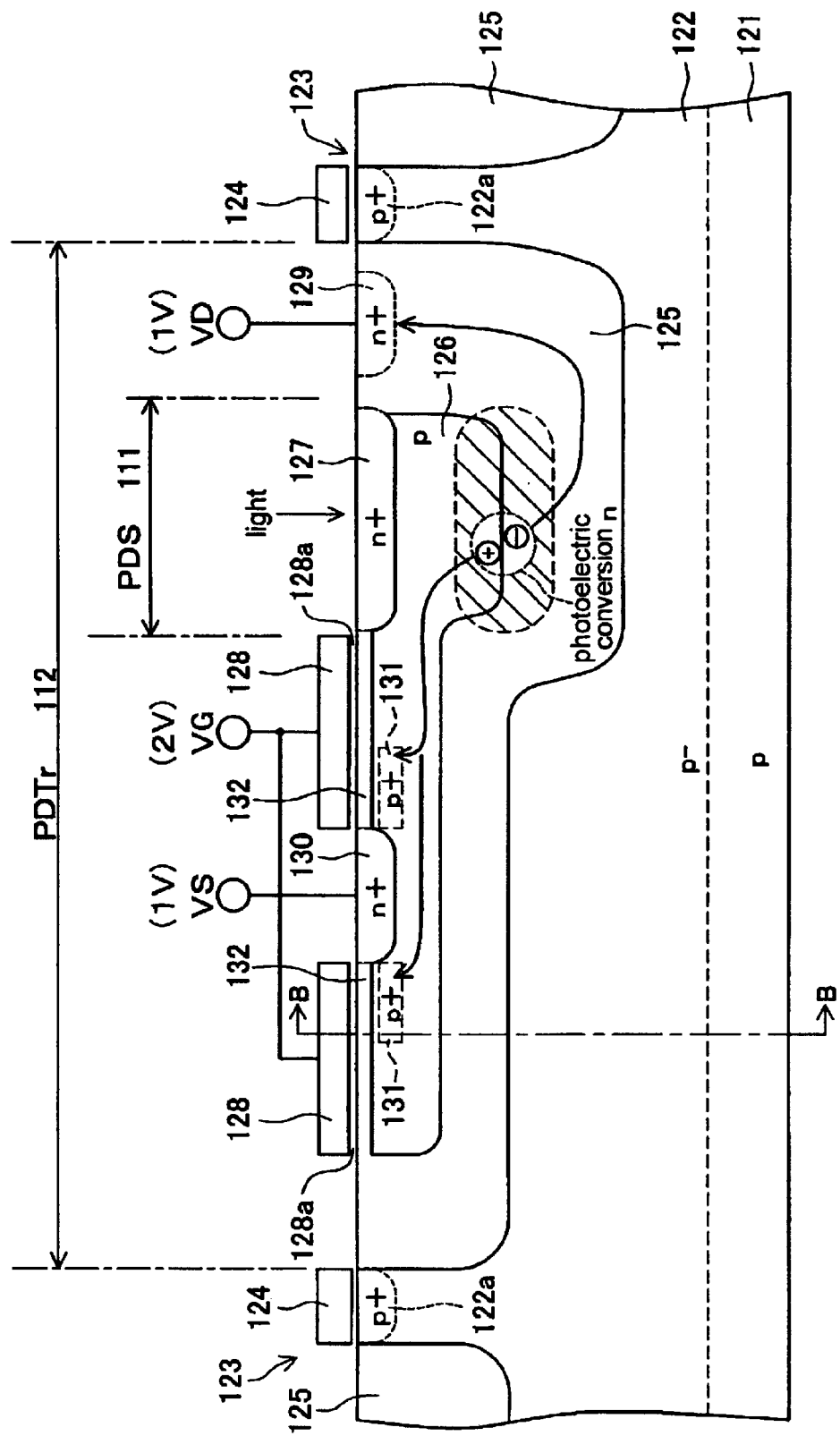
FIG. 5 is an explanatory diagram showing the operation during an accumulation period.

B1. Accumulation Period:

FIG. 5 is an explanatory diagram showing the operation during an accumulation period. FIG. 5 shows a schematic sectional view of the unit pixel 100 as with FIG. 3. In an accumulation period (the period T2 of FIG. 4), light from an image that is picked up is received and photoelectrically converted by the photo diode 111 of the unit pixel 100 that corresponds to each pixel. Then, photoholes that are generated by the photoelectric conversion are accumulated in the carrier pocket 131 of the P well region 126.

In an accumulation period, voltage 2V as the gate voltage VCG and voltage 1V as the drain voltage VD and the source voltage VS are applied to each electrode so as to turn the NMOS transistor 112 "on". Here, each voltage that is applied as the gate voltage VCG, the drain voltage VD, and the source voltage VS is generated by a general constant voltage generating circuit included in the voltage control circuit 60 of FIG. 1. These voltages are provided through the vertical control circuit 30 and the horizontal control circuit 40. Otherwise, there is also the case where voltages are provided from the voltage control circuit 60 directly. The PN junction formed of the N well region 125 and the P well region 126 of the photo diode 111 is in a reverse bias state and a depletion region (a hatching area of FIG. 5 for example) is formed in the vicinity of the junction interface of the PN junction.

In the depletion region, light entering the photo diode 111 is photoelectricaly converted into a charge (a photocharge) as a pair of an electron (a photoelectron) and a hole (a photohole). Here, photoelectrons of photocharges are spread in the N well region 125 and are discharged through the drain diffused region 129. Meanwhile, photoholes are spread in the P well region 126.

Figure 6:
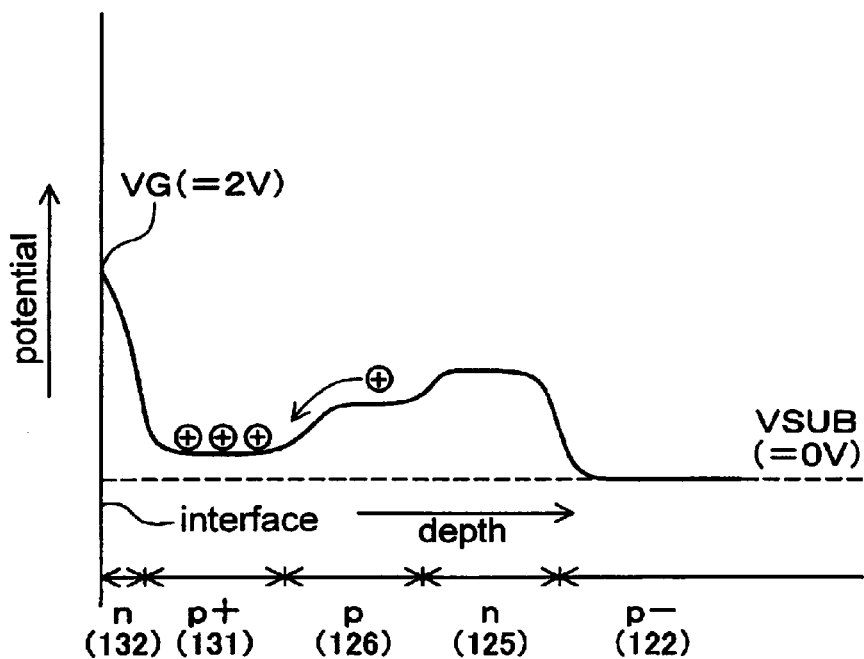
FIG. 6 is an explanatory diagram showing the potential distribution of a section along B—B line of FIG. 5.

FIG. 6 is an explanatory diagram showing the potential distribution of a section along B—B line of FIG. 5. The vertical axis represents potential and the horizontal axis represents the depth from a surface of the substrate (interface). Since the potential of the carrier pocket 131 is lower than that of the P well region 126 as shown in FIG. 6, generated photoholes are collected and accumulated in the carrier pocket 131.

B2. Reading out Period:

A reading out period, namely a signal output period (S output period) shown as the period T3 of FIG. 4 is a period when imaging data based on photoholes accumulated in an accumulation period is read out. In addition, a noise output period (N output period) shown as the period T5 of FIG. 4 is a period when noise data at the state where photoholes are not accumulated is read out.

Figure 7:
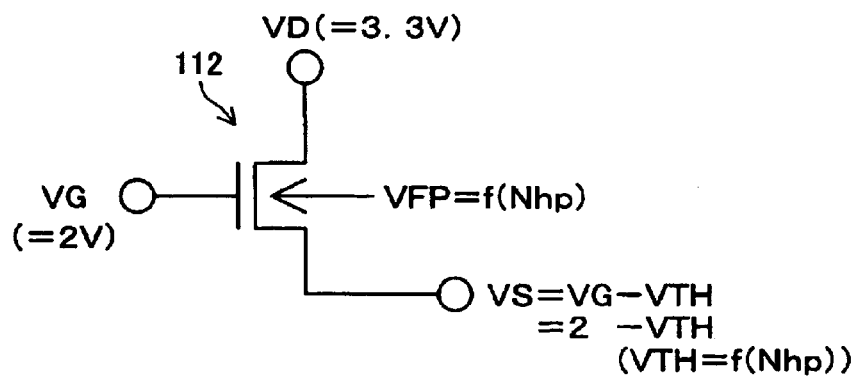
FIG. 7 is an explanatory diagram showing the NMOS transistor during a reading out period.

FIG. 7 is an explanatory diagram showing the NMOS transistor during a reading out period. In a reading out period, the NMOS transistor 112 is operated as a source follower circuit so as to output a signal that is read out as shown in FIG. 7.

In a reading out period, bias voltage is applied to the NMOS transistor 112. For example, voltage 2V as the gate voltage VG is applied to the gate electrode 128 and voltage 3.3V as the drain voltage VD is applied to the drain diffused region (drain electrode) 129 as shown in FIG. 7. A load circuit not shown in the drawing is coupled to the source diffused region (source electrode) 130. At this time, the source voltage VS is represented by the following formula when VTH is threshold voltage of the NMOS transistor 112.

$$VS = VG - VTH \quad (1)$$

Here, the threshold voltage VTH changes depending on the number of photoholes accumulated in the carrier pocket 131. Namely, the threshold voltage VTH is represented by a function f (Nfp) including the number of holes Nhp as a parameter.

Therefore, the source voltage VS represented by formula (1) changes depending on the number of accumulated holes Nhp. Namely, the source voltage VS becomes voltage that depends on the amount of light received by the photo diode 111 such that imaging data is output during an S output period shown as the period T3 of FIG. 4. Furthermore, noise data is output during an N output period shown as the period T5 of FIG. 4.

In addition, imaging data from which a noise component is removed can be obtained by subtracting noise data that is read out during an N output period (the period T5) from imaging data that is read out during an S output period (the period T3).

Figure 8:
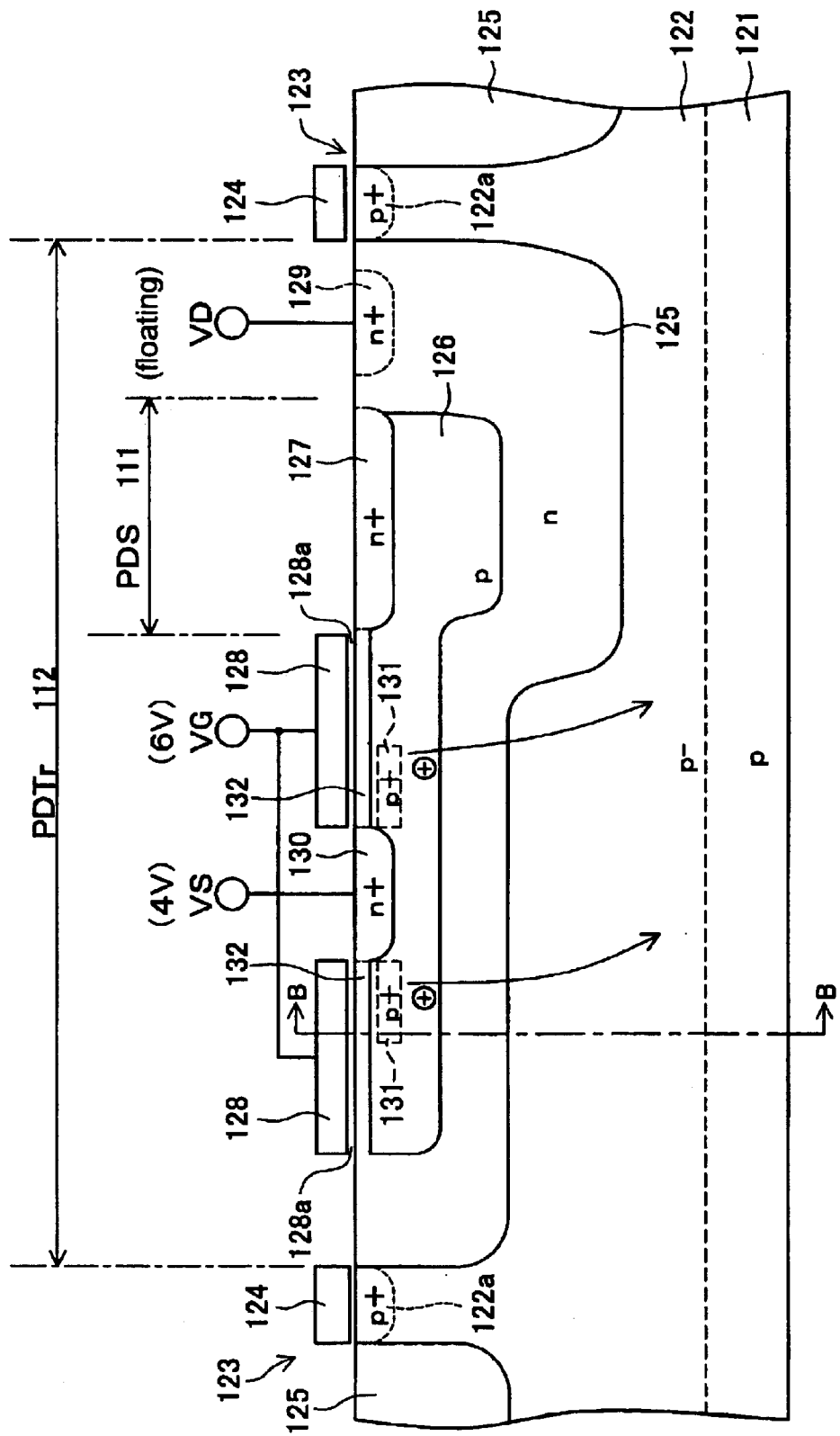
FIG. 8 is an explanatory diagram showing the operation during a reset period.

B3. Reset Period:

FIG. 8 is an explanatory diagram showing the operation during a reset period. FIG. 8 shows a schematic sectional view of the unit pixel 100 as with FIG. 5. In a reset period shown as the period T1 of FIG. 4, residual holes in the carrier pocket 131 are previously discharged toward a side of the P type substrate 121 in order to accumulate photoholes generated in the photo diode 111 during an accumulation period, the period T2. Furthermore, in a reset period shown as the period T4 of FIG. 4, holes that are accumulated in the carrier pocket 131 during an accumulation period, the period T2, are discharged toward a side of the P type substrate 121.

Figure 9:
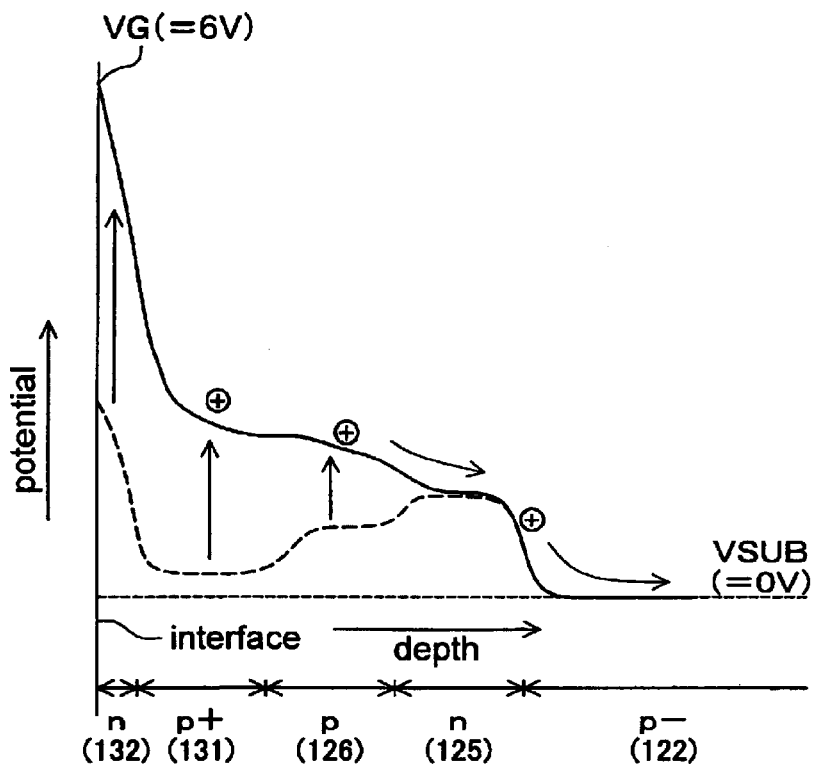
FIG. 9 is an explanatory diagram showing the potential distribution of a section along B—B line of FIG. 8.

FIG. 9 is an explanatory diagram showing the potential distribution of a section along B—B line of FIG. 8. The vertical axis represents potential and the horizontal axis represents the depth from a surface of the substrate (interface).

Here, in a reset period, voltage higher than usual operation voltage is applied to the gate electrode 128, the drain diffused region 129, and the source diffused region 130. For example, as the source voltage VS, voltage 4V is applied to the source diffused region (source electrode) 130. However, substrate voltage VSUB of the P type substrate 121 is GND (an earth: 0V) through a substrate electrode not shown in the drawing and the potential of the P– type substrate layer 122 is almost 0V similarly.

At this time, even if the gate electrode 128 is in a floating state, voltage 6V as the gate voltage VG can be applied thereto by capacitance coupling between the source and the gate. At the same time, since the channel region under the gate electrode 128 becomes conductive, even if the drain voltage VD is in a floating state, voltage 4V that is applied to the source diffused region 130 as the source voltage VS is almost directly applied to the drain diffused region 129 and the N well region 125 including the drain diffused region 129.

At this time, the potential of a surface of the substrate (interface) is highest and potential becomes smaller when distance from the surface of the substrate along a depth direction is larger as shown by a full line of FIG. 9. Therefore, residual holes in the carrier pocket 131 can be discharged toward a side of the P– type substrate layer 122 and the P type substrate 121, whose potentials are lower than that of the carrier pocket 131. Here, a dashed line of FIG. 9 represents potential distribution during an accumulation period, which was shown in FIG. 6.

Figure 10:
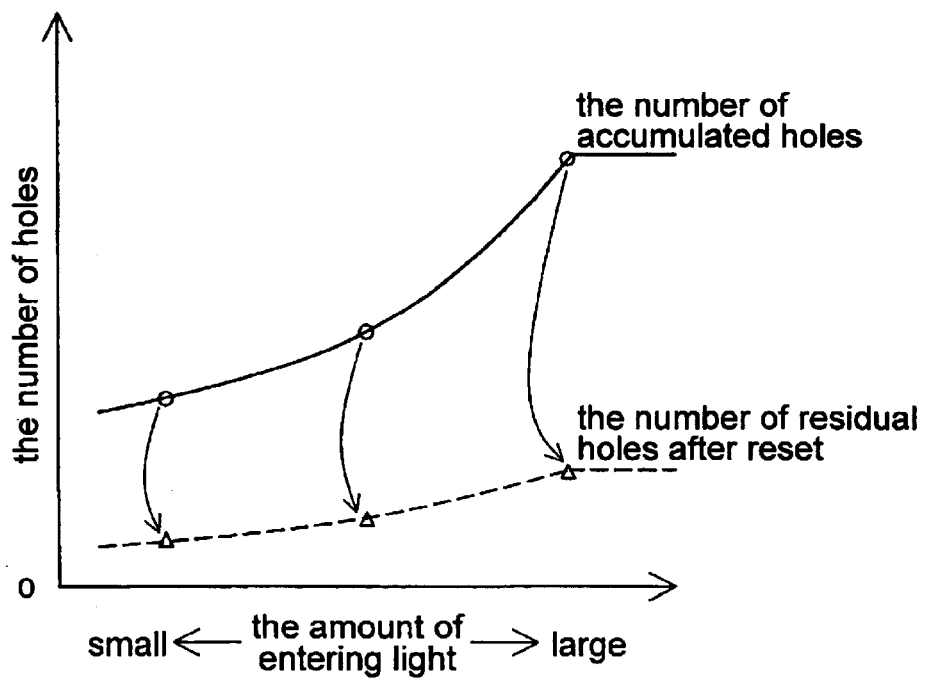
FIG. 10 is an explanatory diagram explaining about the number of residual holes after reset operation is completed in a reset period.

B4. Operations:

FIG. 10 is an explanatory diagram explaining about the number of residual holes after reset operation is completed in a reset period. In the case where photoholes accumulated in the carrier pocket 131 are reset by discharging photoholes from the carrier pocket 131 as described above, the number of residual holes in the carrier pocket 131 is represented by an exponential function including time as a parameter generally. Therefore, regardless of the number of accumulated holes, it is difficult to make the number of residual holes be 0.

Furthermore, the number of accumulated holes in the carrier pocket 131 changes depending on the amount of light entering the photo diode 111. The number of accumulated holes is large when the amount of entering light is large, and is small when it is small. At this time, although the number of holes that are discharged in the same reset period is large when the number of accumulated holes at the start of reset is large, and is small when it is small, the number of residual holes is also large when the number of accumulated holes is large, and is small when it is small. Therefore, depending on the number of accumulated holes, namely the amount of entering light, the number of residual holes that are not discharged from the carrier pocket 131 during a reset period also changes. If the number of residual holes is constant, an effect due to the number of residual holes can be canceled as noise data. However, if the number of residual holes changes depending on the number of accumulated holes as described above, an effect due to the number of residual holes depending on the change of the amount of entering light cannot be canceled such that there is the case where an image that was picked up in the previous cycle remains in an image that is picked up in the next cycle, as a residual image.

C. Imaging Operation of an Embodiment:

In order to solve the problem of the comparative example, an imaging element is operated as explained below in the present embodiment.

Figure 11:
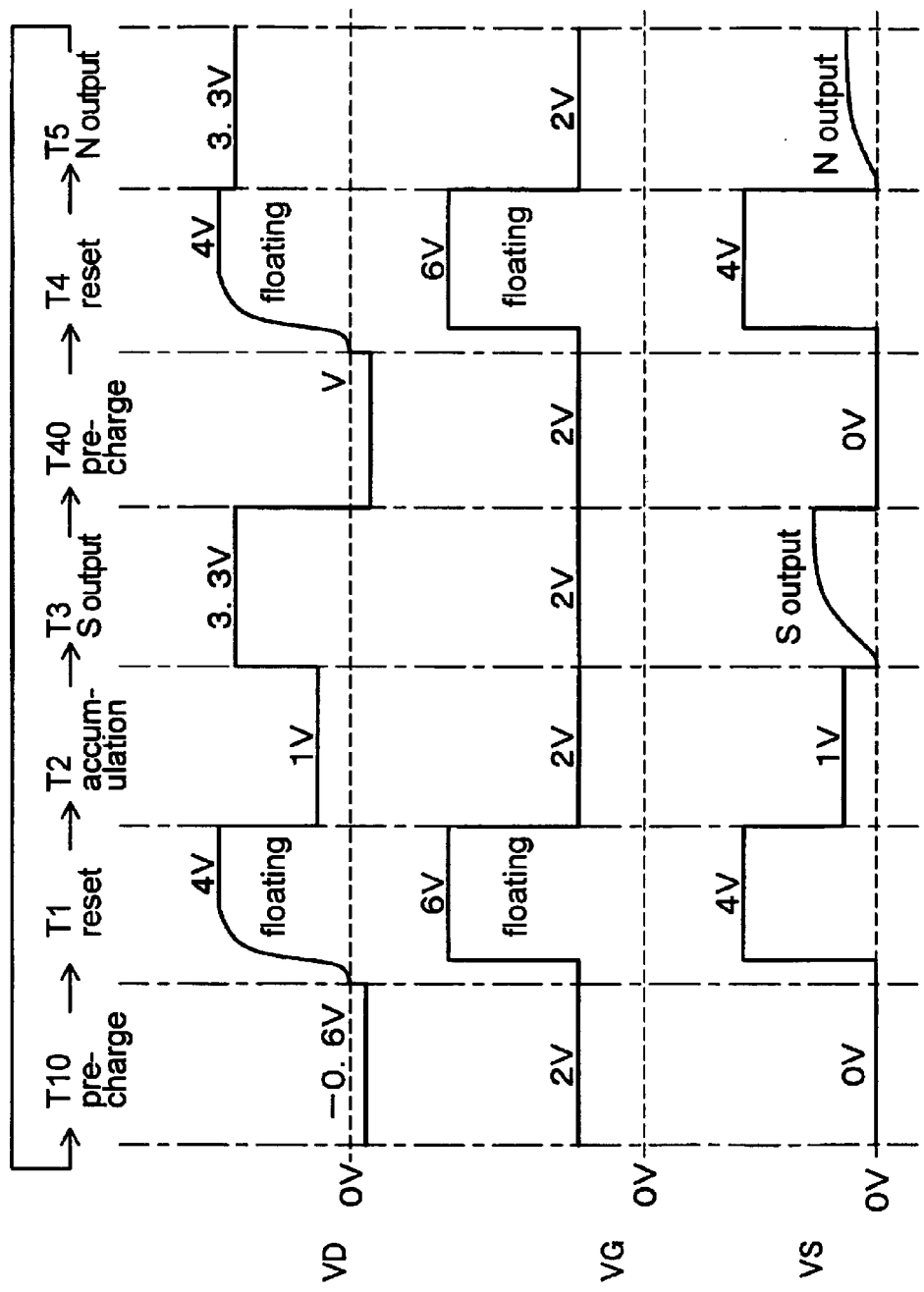
FIG. 11 is an explanatory diagram showing the sequence of imaging in one unit pixel as an embodiment.

FIG. 11 is an explanatory diagram showing the sequence of imaging in one unit pixel as an embodiment. The sequence of the imaging operation of the embodiment is the same as that of the comparative example except that a pre-charge period (a period T10 and a period T40) is set before a reset period (the period T1 and the period T4) in the sequence of imaging as the comparative example of FIG. 4. Therefore, only the operation of the unit pixel 100 during a pre-charge period will be described below.

Figure 12:
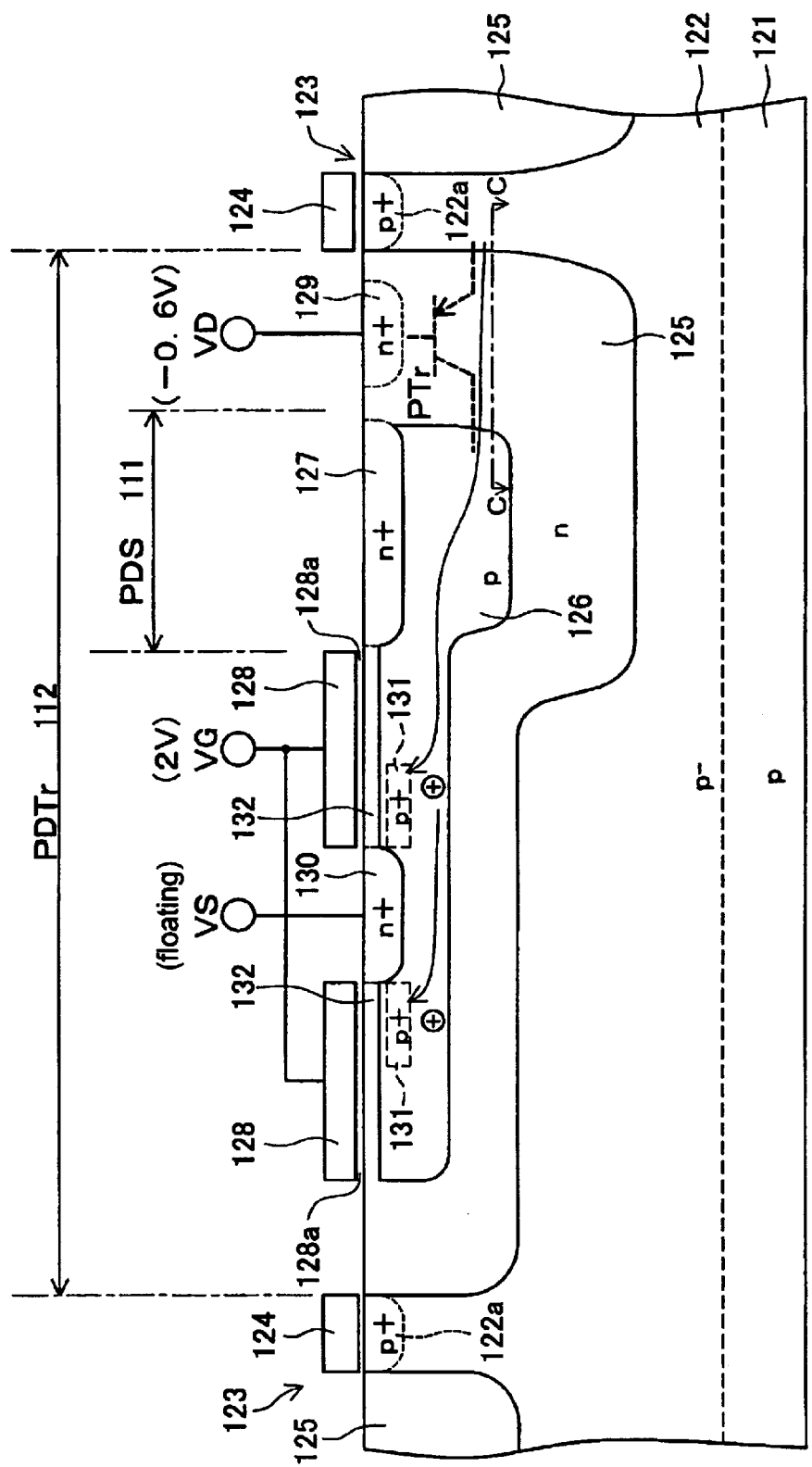
FIG. 12 is an explanatory diagram showing the operation during a pre-charge period.

FIG. 12 is an explanatory diagram showing the operation during a pre-charge period. FIG. 12 shows a schematic sectional view of the unit pixel 100 as with FIG. 3. In a pre-charge period (the period T10 and the period T40 of FIG. 11), holes are accumulated in the carrier pocket 131 before a reset operation during a reset period (the period T1 and the period T4).

Figure 13:
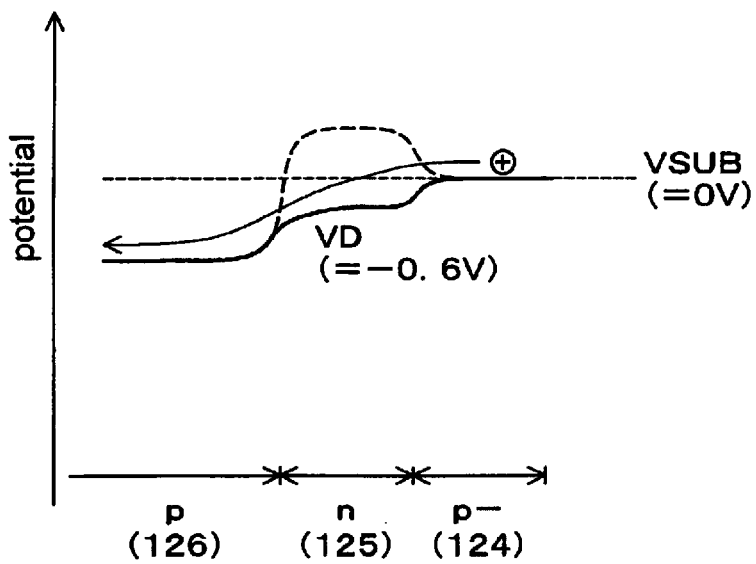
FIG. 13 is an explanatory diagram showing the potential distribution of a section along C—C line of FIG. 12.

FIG. 13 is an explanatory diagram showing the potential distribution of a section along C—C line of FIG. 12. In a pre-charge period, voltage 2V as the gate voltage VG is applied to the gate electrode 128 and voltage −0.6V as the drain voltage VD is applied to the drain diffused region (drain electrode) 129. Here, the substrate voltage VSUB that is applied to the P type substrate 121 is 0V. As shown by a dashed line of FIG. 13, the potential of the N well region 125 is usually higher than that of the P type substrate 121, specifically that of the P− type substrate layer 122 so as to isolate the N well region 125 adjacent thereto. However, if voltage −0.6V is applied to the drain diffused region 129 as the drain voltage VD, the potential of the N well region 125 is lowered as shown by a full line such that the PN junction region between the P− type substrate layer 122 and the N well region 125 becomes a forward bias state effectively. In other words, it can be also considered that a parasitic bipolar transistor (PTr) provided with the P− type substrate layer 122, the N well region 125, and the P well region 126 becomes a conductive state. Thus, holes can be flowed from a side of the P type substrate 121, specifically a side of the P− type substrate layer 122 into the P well region 126. As a result, holes can be accumulated in the carrier pocket 131. Here, although voltage −0.6V is applied as the drain voltage VD in the embodiment, the invention is not limited thereto. Any voltage value is available if only the PN junction region between the P− type substrate layer 122 and the N well region 125 is in a forward bias state. In other words, any voltage value is available if only the parasitic bipolar transistor (PTr) provided with the P− type substrate layer 122, the N well region 125, and the P well region 126 is in a conductive state.

Figure 14:
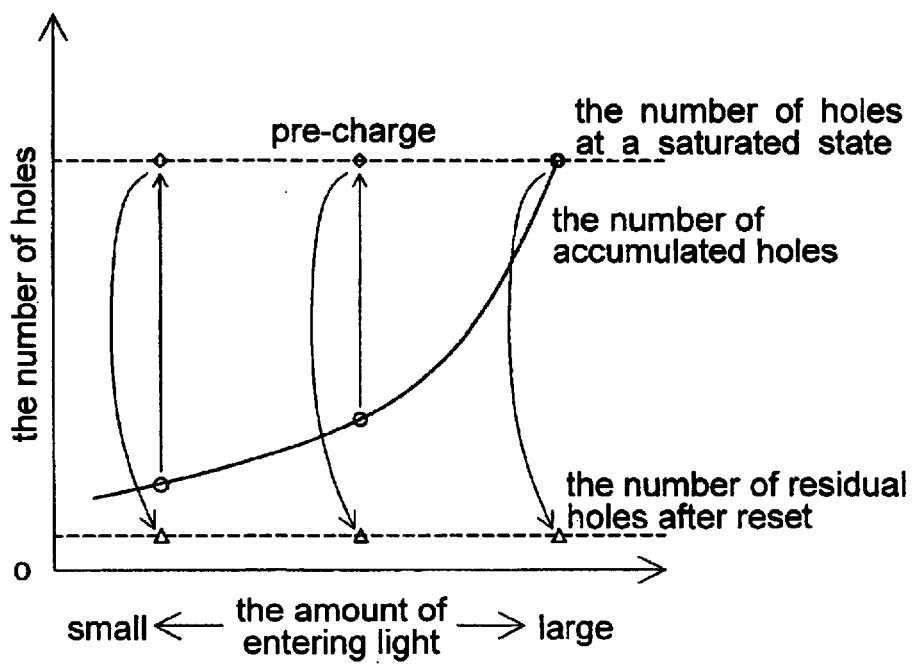
FIG. 14 is an explanatory diagram showing the number of holes after pre-charging.

FIG. 14 is an explanatory diagram showing the number of holes after pre-charging. The number of holes that can be accumulated in the carrier pocket 131 (it is referred to as "the number of holes at a saturated state" hereinafter) is finite. Thus, in a pre-charge period, holes are accumulated so that the carrier pocket 131 is saturated regardless of the number of holes accumulated before pre-charging. This allows the number of holes accumulated in the carrier pocket 131 after pre-charging to be almost constant every time regardless of the number of holes before pre-charging.

If the number of holes before the start of reset is almost constant, the number of residual holes after reset can be almost constant every time, too. Therefore, the effect of residual holes becomes independent of the amount of entering light by subtracting N output in the period T5 of FIG. 11 from S output in the period T3 of FIG. 11 such that the problem of a residual image due to residual holes, which was shown in the imaging operation of the comparative example, can be avoided. Therefore, in a solid-state imaging element of a threshold voltage modulation system like the embodiment, the deterioration of image quality caused by a residual image due to photoholes accumulated in previous imaging can be avoided.

D. Drain Control Circuit:

The drain voltage VD during a pre-charge period is controlled by a drain control circuit shown below. Here, the drain control circuit is included in the voltage control circuit 60 of FIG. 1.

Figure 15:
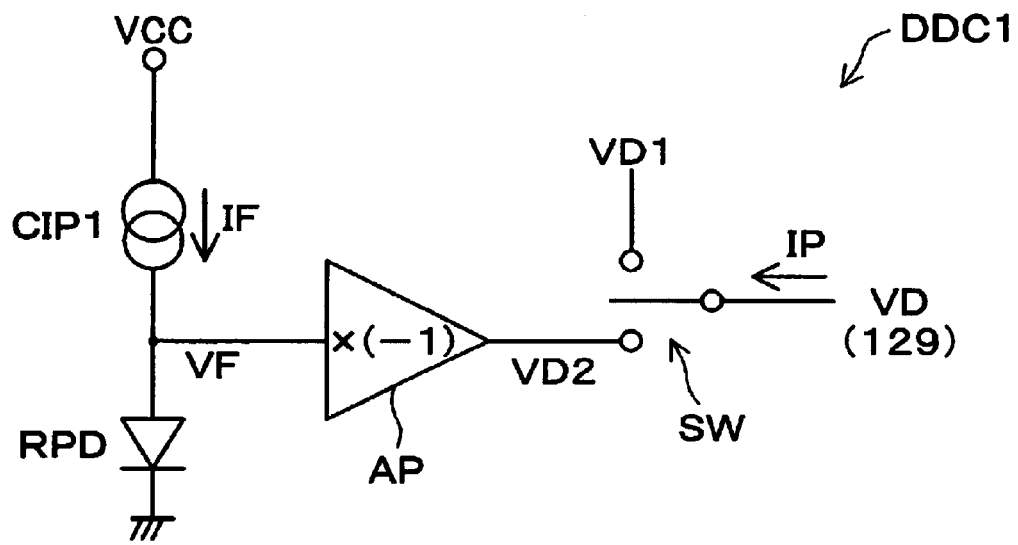
FIG. 15 is an explanatory diagram showing a drain control circuit of a first example.

D1. First Example:

FIG. 15 is an explanatory diagram showing a drain control circuit of a first example. A drain control circuit DDC1 includes a constant current source CIP1, a diode RPD that are connected in series between two supply voltages VCC and GND (GND is also referred to as "ground potential" and is 0V), an inverting amplifier AP of one time, and a switch SW. During a pre-charge period, an output from the inverting amplifier AP is selected by the switch SW such that output voltage VD2 from the inverting amplifier AP is provided to the drain diffused region 129 as the drain voltage VD. During a period other than a pre-charge period (a non-pre-charge period), an output from a constant voltage circuit not shown in the drawing is selected such that output voltage VD1 is provided to the drain diffused region 129 as the drain voltage VD.

A current IF that is output from the constant current source CIP1 is applied to the diode RPD so as to forward bias a PN junction region of the diode RPD. This makes forward voltage VF (positive voltage) from the diode RPD to be input to an input of the inverting amplifier AP. The forward voltage VF is converted into negative voltage −VF by the inverting amplifier so as to be output as the output voltage VD2. In addition, the forward voltage VF is usually from about 0.6V to about 1V. In the present case, it is 0.6V as described above. Therefore, the drain control circuit DDC1 can supply negative voltage −VF (=−0.6V) as the drain voltage VD in a pre-charge period. This makes the PN junction region between the P− type substrate layer 122 and the N well region 125 of the unit pixel 100 (see, FIG. 12) to be forward biased as described above, and thereby a current IP can be applied from the P− type substrate layer 122 to the drain diffused region 129 through the N well region 125. Then, a current (IP·Hfe) which is produced by amplifying the current IP by a factor of a current amplification factor Hfe can be applied from the P-substrate layer 122 to the P well region 126 through the N well region 125. This enables holes whose amount depends on the current (IP·Hfe) applied from a side of the P– type substrate layer 122 to the P well region 126 to be provided. As a result, holes can be accumulated in the carrier pocket 131.

Here, as the diode RPD, a PN junction region between the P– type substrate 122 and the N well region 125 of a dummy unit pixel that has the same structure as that of the unit pixel 100, is utilized for the reason described below.

A current (IP+IP·Hfe), which is applied to the PN junction region by forward biasing it, changes depending on the temperature of the PN junction region. This PN junction region exists between the P– type substrate layer 122 and the N well region 125 of the unit pixel 100. For example, when the temperature is high, a desired current (transfer of charges) can be obtained by comparatively low bias voltage of a forward direction (it is also referred to as "forward voltage"). On the other hand, when the temperature is low, a desired current can not be obtained if comparatively high bias voltage of a forward direction is not applied. Therefore, if the voltage applied as the drain voltage VD during a pre-charge period is fixed at, for example, –0.6V, there is the case where a desired current (transfer of charges) can not be obtained, depending on the temperature of the PN junction region. In addition, there is the case where an excess current (transfer of unnecessary charges) is generated so as to cause the increase of power consumption.

In the drain control circuit DDC1 of the present example, the PN junction region between the P– type substrate layer 122 and the N well region 125 of a dummy unit pixel is utilized as the diode RPD as described above. Therefore, as with the temperature change of the PN junction region of the unit pixel 100, the temperature of the diode RPD also changes. This allows the forward voltage VF from the diode RPD to be changed in response to the temperature change such that the drain voltage VD applied to the drain diffused region can be changed. Therefore, the bias state of the PN junction region of the unit pixel 100 becomes in a desired state corresponding to the temperature change. As a result, it can be prevented that a desired amount of charges (holes) can not be transferred due to the temperature change of the PN junction region. In addition, the increase of power consumption due to the transfer of unnecessary charges (holes) can be reduced.

Furthermore, if, in a pre-charge period, the period when an output from the inverting amplifier AP is selected by the switch SW is changed in response to the temperature change of the PN junction region of the unit pixel 100, the increase of power consumption due to the transfer of unnecessary charges can be further reduced. Regarding a method of detecting the temperature change of the PN junction region of the unit pixel 100, the temperature change can be easily evaluated from the change of the forward voltage VF from the diode RPD in the drain control circuit DDC1.

Figure 16:
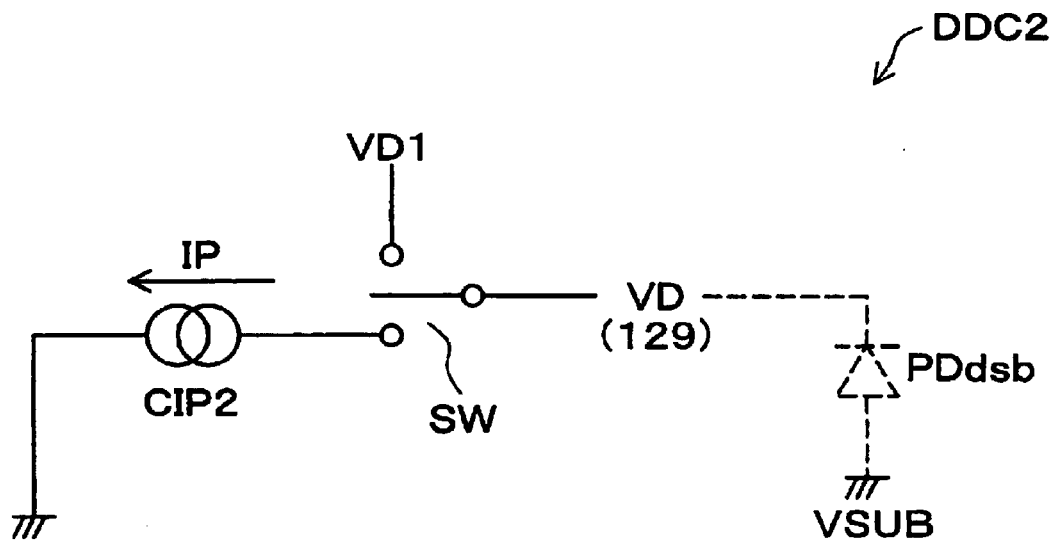
FIG. 16 is an explanatory diagram showing a drain control circuit of a second example.

D2. Second Example:

FIG. 16 is an explanatory diagram showing a drain control circuit of a second example. A drain control circuit DDC2 includes a constant current source CIP2 and the switch SW. During a non-pre-charge period, an output from a constant voltage circuit not shown in the drawing is selected by the switch SW such that output voltage VD1 is provided to the drain diffused region 129 as the drain voltage VD.

During a pre-charge period, an output from the constant current source CIP2 is selected by the switch SW such that the current IP is applied to a PN junction region PDdsb between the P– substrate layer 122 and the N well region 125 of the unit pixel 100 (see, FIG. 12) so as to forward bias the PN junction region PDdsb. Then, the current (IP·Hfe), which is produced by amplifying the current IP by a factor of the current amplification factor Hfe, can be applied from the P– type substrate layer 122 to the P well region 126 through the N well region 125. This enables holes whose amount depends on the current (IP·Hfe) to be provided to the P well region 126. As a result, holes can be accumulated in the carrier pocket 131. In addition, at this time, the drain voltage VD of the drain diffused region 129 becomes the voltage depending on the forward voltage from the PN junction region PDdsb, which is forward biased.

Then, in the case of the drain control circuit DDC2 of the present example, the current (IP·Hfe), which is produced by amplifying the current IP by a factor of the current amplification factor Hfe, can be applied from the P– type substrate layer 122 to the P well region 126 through the N well region 125 as described above. The current amplification factor Hfe is the ratio of a current applied from the P– type substrate layer 122 to the P well region 126 through the N well region 125 to a current applied from the P– type substrate layer 122 to the drain diffused region 129 through the N well region 125. Therefore, if the current IP is constant, the current (IP·Hfe) applied to the P well region also becomes almost constant regardless of the temperature change of the PN junction region between the P– type substrate layer 122 and the N well region 125. Therefore, in the case where the drain control circuit DDC2 of the present invention is used, it can be prevented that a desired amount of charges (holes) can not be transferred due to the temperature change of the PN junction region. In addition, the increase of power consumption due to the transfer of unnecessary charges (holes) can be reduced.

Furthermore, if, in a pre-charge period, the period when an output from the constant current source CIP2 is selected by the switch SW is changed in response to the temperature change of the PN junction region of the unit pixel 100, the increase of power consumption due to the transfer of unnecessary charges can be further reduced. Regarding a method of detecting the temperature change of the PN junction region of the unit pixel 100, the temperature change can be easily evaluated from the change of the forward voltage VF from the diode RPD in the drain control circuit DDC1 of the first example.

Figure 17A:
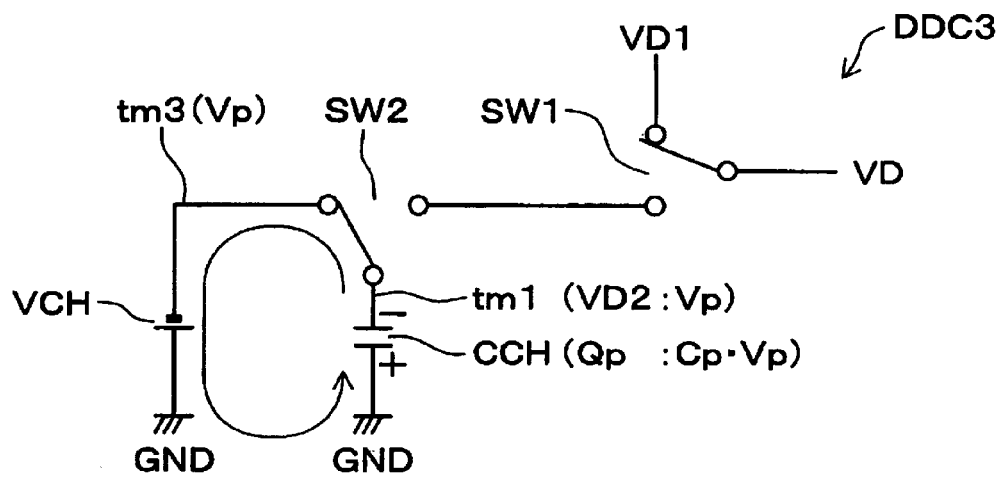
FIG. 17 is an explanatory diagram showing a drain control circuit of a third example.

D3. Third Example:

FIG. 17 is an explanatory diagram showing a drain control circuit of a third example. A drain control circuit DDC3 includes a capacitor CCH, a power source VCH for charging, and two switches SW1 and SW2. During a non-pre-charge period, as shown in FIG. 17(A), an output from a constant voltage circuit (not shown in the drawing) is selected by the switch SW1 such that output voltage VD1 is provided to the drain diffused region 129 (see, FIG. 12) as the drain voltage VD.

In addition, a terminal tm1 of the capacitor CCH, which is opposite to a terminal connected to the ground potential GND, is connected to an output terminal tm3 of the power source VCH for charging by the switch SW2. Then, the capacitor CCH is charged by the power source VCH for charging such that the voltage VD2 of the terminal tm1 of the capacitor CCH becomes almost same as voltage Vp of the output terminal tm3 of the power source VCH for charging. At this time, charges Qp (=Cp·Vp: Cp is the capacitance of the capacitor CCH) are accumulated in the capacitor CCH. In addition, the voltage Vp of the output terminal tm3 of the power source VCH for charging is set to be negative voltage in order to forward bias the PN junction region between the P– type substrate layer 122 and the N well region 125. The voltage Vp is set within the range from about −1.0V to about −3V, although it depends on the amount of the charges Qp that is to be accumulated in the capacitor CCH and the magnitude of the capacitance Cp of the capacitor CCH as described below.

Figure 17B:
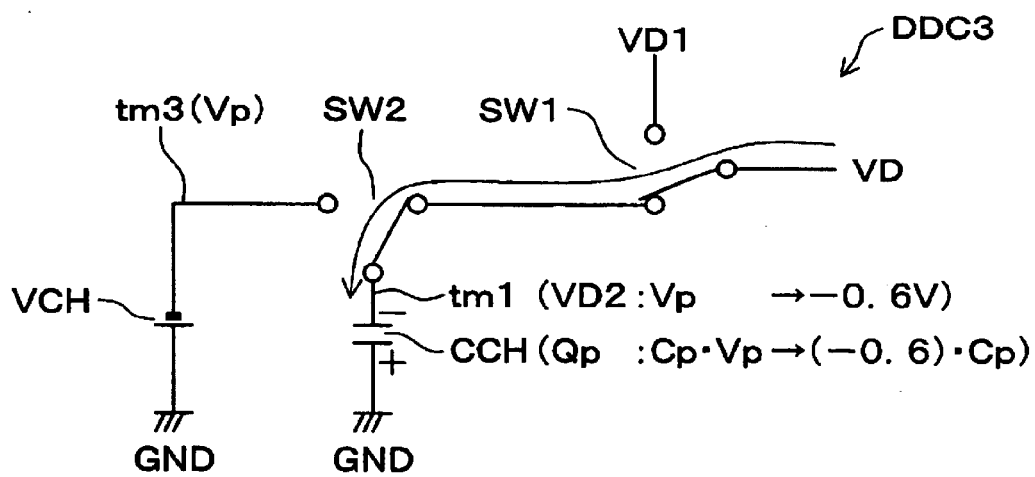

During a pre-charge period, as shown in FIG. 17(B), the terminal tm1 of the capacitor CCH is isolated from the power source VCH for charging so as to be connected to the switch SW1 by the switch SW2, while the voltage VD2 of the terminal tm1 of the capacitor CCH is provided to the drain diffused region 129 as the drain voltage VD by the switch SW1. At this time, charges (holes) are transferred from the P− type substrate layer 122 of the unit pixel 100 (see, FIG. 12) to the capacitor CCH through the N well region 125 and the drain diffused region 129 so that the charges Qp accumulated in the capacitor CCH are canceled. Then, in response to the transfer of the charges, the charges (holes) which are obtained by amplifying the charges Qp by a factor of the current amplification factor Hfe are provided from the P− type substrate layer 122 to the P well region 126 through the N well region 125. As a result, holes can be accumulated in the carrier pocket 131.

Here, in the present example, the period when holes are provided from the P− type substrate layer 122 to the P well region 126 is during the period when charges (holes) are transferred from the P− type substrate layer 122 to the capacitor CCH through the N well region 125 and the drain diffused region 129 so as to cancel the charges Qp accumulated in the capacitor CCH. In other words, such period is until the voltage VD2 of the terminal tm1 is changed from the voltage Vp to −0.6V. In addition, the current applied to the drain diffused region 129 by the transfer of charges is not a constant current like the current in the second example, but changes depending on the amount of charges accumulated in the capacitor. Therefore, the capacitance CP of the capacitor CCH and the voltage Vp of the power source VCH for charging are preferably adjusted so that charges necessary for making the number of holes accumulated in the carrier pocket 131 during a pre-charge period be the number of holes at a saturated state, are previously charged into the capacitor CCH. This enables the increase of power consumption due to the transfer of unnecessary charges (holes) to be reduced. Furthermore, it can be prevented that a desired amount of charges (holes) can not be transferred due to the temperature change of the PN junction region.

D. Modifications:

It should be understood that the present invention is not limited to the above-described examples and embodiments, but that various kinds of modifications can be made without departing from the scope and spirit of the present invention. For example, the following modifications are available.

Although pre-charging is executed so that the number of holes accumulated in the carrier pocket becomes a saturated state in the above-described embodiment, the present invention is not limited thereto and pre-charging may be executed so that the number of holes becomes a predetermined value without becoming a saturated state.

In the above-described embodiment, the case where the photo diode 111 and the transistor 112 for detecting photocharges share the P well region 126, and the transistor 112 for detecting photocharges is an NMOS transistor is described. However, a structure where the well region shared by the photo diode and the transistor for detecting photocharges is an N type well region, and the transistor for detecting photocharges is a PMOS transistor is available. In this case, photocharges (carriers) accumulated in the carrier pocket are not holes but electrons. In addition, the parasitic bipolar transistor, which becomes a conductive state during a pre-charge period, is not a PNP transistor but an NPN transistor. Corresponding to this, the polarities of the voltage, the current, and the charges that are generated by the drain diffused circuit of each examples are accordingly changed.

What is claimed is:

1. A solid-state imaging device, comprising:
   a pixel array including a plurality of unit pixels, each of the unit pixels including a photo diode and an insulated gate field effect transistor that detects photocharges; and
   a control circuit that controls an operation of the pixel array, wherein:
   the photo diode and the insulated gate field effect transistor share a well region of a first conductivity type that is formed in a semiconductor layer of a second conductivity type, the semiconductor layer of the second conductivity type being formed on a semiconductor substrate of the first conductivity type;
   the insulated gate field effect transistor comprises:
      a source diffused region of the second conductivity type formed on a surface of the well region;
      a drain diffused region of the second conductivity type formed on a surface of the semiconductor layer other than the surface of the well region;
      a gate electrode formed above the well region between the drain diffused region and the source diffused region with a gate insulating film therebetween;
      a channel region formed in the surface of the well region below the gate electrode and having an impurity layer of the second conductivity type; and
      a heavily doped buried layer of the first conductivity type formed below the channel region in the well region and adjacent to the source diffused region, having an impurity concentration higher than that of the well region, and being an accumulation region that accumulates charges of a given conductivity type generated in response to light incident on the photo diode;
   the control circuit comprises a drain control circuit providing any of constant voltage, a constant current, and constant charges to the drain diffused region; and
   the control circuit previously forward biases a junction region between the semiconductor substrate and the semiconductor layer by the any of the constant voltage, the constant current, and the constant charges, that is provided from the drain control circuit to the drain diffused region, so as to accumulate a predetermined amount of the charges of the given conductivity type in the accumulation region, and the charges of a given conductivity type accumulated in the accumulation region being discharged thereafter.

2. The solid-state imaging device according to claim 1, the drain control circuit comprising a dummy diode with a junction region between the semiconductor substrate and the semiconductor layer included in a dummy pixel that has a same structure as the structure of the unit pixel, and a constant current source providing a forward current to the dummy diode; and
   the drain control circuit generating the constant voltage that is provided to the drain diffused region, based on forward voltage from the dummy diode.

3. The solid-state imaging device according to claim 1, the drain control circuit comprising a constant current source and generating the constant current that is provided to the drain diffused region.

4. The solid-state imaging device according to claim 1,
the drain control circuit including a capacitor, a power source that charges the capacitor, and a switch connecting one terminal of the capacitor to either of an output terminal of the power source for charging and the drain diffused region;

the drain control circuit connecting one terminal of the capacitor to the output terminal of the power source for charging so as to charge the capacitor during a period other than a predetermined period when the junction region between the semiconductor substrate and the semiconductor layer is forward biased; and the drain control circuit connecting the one terminal of the capacitor to the drain diffused region so as to generate the constant charges that are provided to the drain diffused region, during the predetermined period.

5. The solid-state imaging device according to claim 1, a state where a predetermined amount of the charges of a given conductivity type are accumulated being a saturated state where a maximum amount of available charges of a given conductivity type are accumulated in the accumulation region.

6. The solid-state imaging device according to claim 1, the charges of the given conductivity type being holes if the first conductivity type is a P type and the second conductivity type is an N type.

7. The solid-state imaging device according to claim 1, the charges of the given conductivity type being electrons if the first conductivity type is an N type and the second conductivity type is a P type.

* * * * *